United States Patent
Gider et al.

(10) Patent No.: US 6,873,542 B2
(45) Date of Patent: Mar. 29, 2005

(54) ANTIFERROMAGNETICALLY COUPLED BI-LAYER SENSOR FOR MAGNETIC RANDOM ACCESS MEMORY

(75) Inventors: Savas Gider, Mountain View, CA (US); Vladimir Nikitin, Campbell, CA (US)

(73) Assignee: International Business Machines Corporation, Armonk, NY (US)

( * ) Notice: Subject to any disclaimer, the term of this patent is extended or adjusted under 35 U.S.C. 154(b) by 150 days.

(21) Appl. No.: 10/263,495

(22) Filed: Oct. 3, 2002

(65) Prior Publication Data

US 2004/0066668 A1 Apr. 8, 2004

(51) Int. Cl.⁷ .............................................. G11C 11/00
(52) U.S. Cl. ...................... 365/158; 365/171; 365/173
(58) Field of Search ................................ 365/158, 171, 365/173

(56) References Cited

U.S. PATENT DOCUMENTS

| | | | |
|---|---|---|---|
| 3,350,180 A | 10/1967 | Croll | 428/635 |
| 3,375,091 A | 3/1968 | Feldtkeller | 291/94 |
| 3,582,912 A | 6/1971 | Valin et al. | 340/174 |
| 5,408,377 A | 4/1995 | Gurney et al. | 360/113 |
| 5,703,805 A | 12/1997 | Tehrani et al. | 365/173 |
| 5,745,408 A | 4/1998 | Chen et al. | 365/173 |
| 5,841,692 A | 11/1998 | Gallagher et al. | 365/173 |
| 5,953,248 A | 9/1999 | Chen et al. | 365/158 |
| 5,959,880 A | 9/1999 | Shi et al. | 365/158 |
| 5,966,012 A | 10/1999 | Parkin | 324/252 |
| 5,966,323 A | 10/1999 | Chen et al. | 365/158 |
| 6,114,719 A | 9/2000 | Dill et al. | 257/295 |
| 6,153,320 A | 11/2000 | Parkin | 428/693 |
| 6,166,948 A * | 12/2000 | Parkin et al. | 365/173 |
| 6,172,904 B1 | 1/2001 | Anthony et al. | 365/173 |
| 6,205,053 B1 | 3/2001 | Anthony | 365/173 |
| 6,633,498 B1 * | 10/2003 | Engel et al. | 365/158 |
| 6,711,052 B2 * | 3/2004 | Subramanian et al. | 365/158 |

OTHER PUBLICATIONS

U.S. Appl. No. 10/154,796, filed May 24, 2002.
U.S. Appl. No. 09/972,286, filed Oct. 5, 2001.

* cited by examiner

*Primary Examiner*—Son T. Dinh
(74) *Attorney, Agent, or Firm*—Ron Feece; William D. Gill

(57) ABSTRACT

A magnetic tunnel junction (MTJ) memory array having a magnetically stable free layer that can be switched from one memory state to another with a minimum of energy input. The memory array includes a MTJ cell having an antiparallel coupled free layer. An electrically conductive word line passes through the free layer such that current passed through the electrically conductive word line induces a magnetic field that acts on antiparallel coupled layers of the free layer causing their magnetizations to rotate while remaining antiparallel to one another.

17 Claims, 4 Drawing Sheets

ANTIFERROMAGNETICALLY COUPLED BI-LAYER SENSOR FOR MAGNETIC RANDOM ACCESS MEMORY

FIELD OF THE INVENTION

The present invention relates to Magnetic Random Access Memory, and more particularly to an improved Magnetic Random Access Memory Array using magnetically stable tunnel junction cells configured for low energy switching.

BACKGROUND OF THE INVENTION

Magnetic tunnel junctions (MTJ) form promising candidates for nonvolatile memory storage cells to enable a dense, fast, nonvolatile magnetic random access memory (MRAM). The magnetic tunnel junction comprises at least two ferromagnetic layers separated by a thin insulating layer. The conductance of the device depends on the relative magnetic orientation of the magnetic moments of the ferromagnetic layers. The lateral size of the MTJ storage cell must be of sub-micron dimensions to be competitive with today's DRAM memories with 10–100 Mbit capacities. Moreover, the lateral size of the MTJ storage cell will need to be further reduced as memory capacities further increase in the future.

The required small sample size of the MTJ storage cell leads to several problems. First, as the lateral dimensions of the cells are reduced, the volume of each of the magnetic layers in the MTJ device are also reduced, which leads to the possibility of "super-paramagnetic" behavior, i.e., thermal fluctuations can cause the magnetic moment of a magnetic entity to spontaneously rotate or flip. Even though this could be addressed by increasing crystalline or shape anisotropy of the magnetic entity, such increase is not practical, as it would require increasingly higher magnetic fields, and thus currents, to controllably switch the magnetic state of the cell. Secondly, with increasing density of the cells, the distance between cells is reduced, leading to the increase of the magnetic field at a cell location produced by the magnetization of the neighboring cells. Thus, the magnetic switching field of a given MTJ cell will depend on the magnetic state of its neighboring cells, leading to either higher margin of the write operation of the memory array, or to spontaneous switching of the cell due to the state of its neighbors. Unless these magnetostatic interactions can be mitigated they will eventually limit the smallest size attainable by the MTJ cells and the highest density of the MTJ MRAM.

In order to overcome these limitation and make a more stable MRAM device, MTJs have been constructed such that either or both of the free and pinned ferromagnetic layers are constructed each as a pair of antiparallel coupled ferromagnetic layers separated by a non-magnetic spacer layer. Such devices are described in IBM U.S. Pat. Nos. 6,166,948 and 5,966,012. An example of such a prior art MTJ is described with reference to FIG. 1. The prior art MTJ 2 is sandwiched between first and second electrically conductive lines 3, 5 which are arranged perpendicular to one another with line 5 extending out of the plane of the page. The MTJ 2 is disposed entirely between the lines 3 and 5, and electrically connects them with one another. The resistance, and associated memory state, of the MTJ 2 is determined by applying a voltage across the MTJ between the lines 3 and 5. The MTJ 2 includes a free ferromagnetic layer 4 and a pinned ferromagnetic layer 6. The free layer 4 includes first and second ferromagnetic layers 8, 10 which sandwich an antiferromagnetic coupling layer 12 therebetween. The antiferromagnetic coupling layer can be constructed of Ru and is of such a thickness as to antiparallel couple the first and second ferromagnetic layers 8, 10 with one another. Similarly, the pinned layer 6 is constructed of first and second ferromagnetic layers 14, 16, which are antiparallel coupled across a Ru coupling layer 18. The free and pinned layers 4, 6 are separated by a tunnel barrier layer 20 such as $Al_2O_3$. The Pinned layer 6 is formed upon an anitferromagnetic (AFM) material 22 such as PtMn. Strong exchange coupling between the AFM layer 22 and the second layer 16 of the pinned layer 6 keeps the second layer 16 strongly pinned along a predetermined direction, preferably along its easy axis of magnetization. The antiferromagnetic coupling across the Ru coupling layer 18, keeps the first layer 14 strongly pinned antiparallel to the second ferromagnetic pinned layer 16 as indicated by arrows 24. The ferromagnetic layers 8, 10 have a magnetic anitsotropy that tends to keep their magnetizations aligned along an axis that is parallel with the magnetizations of the pinned layer 6 as indicated by arrows 26.

With continued reference to FIG. 1, it will be appreciated by those skilled in the art that, with the magnetizations of the free and pinned layers 4, 6 aligned as shown, the MTJ will be in a high resistance state. In order to put the MTJ into a low resistance state, and thereby change its memory state, an electrical current is passed through a conductive line 5 which runs along a direction perpendicular to the directions of magnetization of the free and pinned layers 4, 6. A current directed out of the plane of the page as indicated by arrow head 30 will induce a magnetic field thereabout according to the right hand rule as indicated by arrow 32.

The antiparallel coupling of the free layer promotes stability of the free layer making it less susceptible to unintentional switching due to temperature or extraneous magnetic fields. In addition, the antiparallel coupling of the pinned and free layers 4, 6 reduces undesirable magnetostatic coupling between the pinned and free layers 4, 6 which would otherwise cause the free layer to be biased toward one of its two possible magnetic states. Unfortunately, this prior art MTJ array requires a relatively strong magnetic field to switch the magnetic state of the free layer. This requires a large electrical current to be passed through the conductive lines 5 and 3 which increases power consumption to unacceptably high levels. Also, the high field necessary to switch the free layer increases the risk of affecting adjacent MTJ cells, requiring undesirably high spacing between adjacent cells.

Therefore, there is a need for a MTJ array having MTJ cells which can be efficiently switched while also being magnetically stable. Such a MTJ array would preferably be minimally affected by extraneous magnetic fields and temperature fluctuations, while requiring a minimum of energy to switch from one memory state to another.

SUMMARY OF THE INVENTION

The present invention provides a Magnetic Random Array Memory (MRAM) having magnetically stable array cells which can be efficiently switched from one memory state to another with a minimum of input enery. The individual bits in the MRAM can be either magnetic tunnel junction (MTJ), or giant magnetoresistance (GMR) cells. For ease of referencing, application MTJ cells is described herein.

The MTJ cell includes an anitparallel coupled free layer having first and second ferromagnetic layers separated by a non-magnetic coupling layer. The non-magnetic spacer layer is chosen to be a thickness that will antiparallel couple the first and second ferromagnetic layers, which means that the first and second free layers have magnetizations that tend to align parallel to one another in opposite directions. The two magnetic layers in the free layer can be coupled through either exchange coupling, or by purely magnetostatic interaction. An electrically conductive line is connected with the free layer such that current passed through the line is conducted generally centrally through the antiparallel coupled free layer. A current passed through the electrically conductive line induces a magnetic field that acts on both the first and second ferromagnetic layers in opposite directions allowing their magnetizations to rotate in unison while remaining antiparallel to one another. In this way the first and second layers of the free layer can be caused to rotate while remaining in their lowest possible energy state.

The present invention also includes a magnetically pinned layer which may consist of a single ferromagnetic layer or may be an antiparallel coupled pinned layer. The magnetization of the pinned layer may be set by exchange coupling with an antiferromagnetic material, such as PtMn. The free and pinned layers may be separated by a thin layer of insulating material such as $Al_2O_3$. The ferromagnetic material of the free and pinned layers may include alloys of Fe and Ni, and may also include alloys of Co.

A second electrically conductive line arranged along a direction generally perpendicular to the first electrically conductive line may be connected with the MTJ cell at the pinned layer side of the MTJ cell. The resistance of the insulating material separating the free and pinned layers is variable depending upon the relative magnetic states of the free and pinned layer, and this resistance can be detected by applying a voltage across the MTJ cell between the first and second electrically conductive lines.

For a fuller understanding of the nature and advantages of the present invention, reference should be made to the following detailed description taken together with the accompanying figures.

DETAILED DESCRIPTION OF THE PREFERRED EMBODIMENTS

Figure 2:
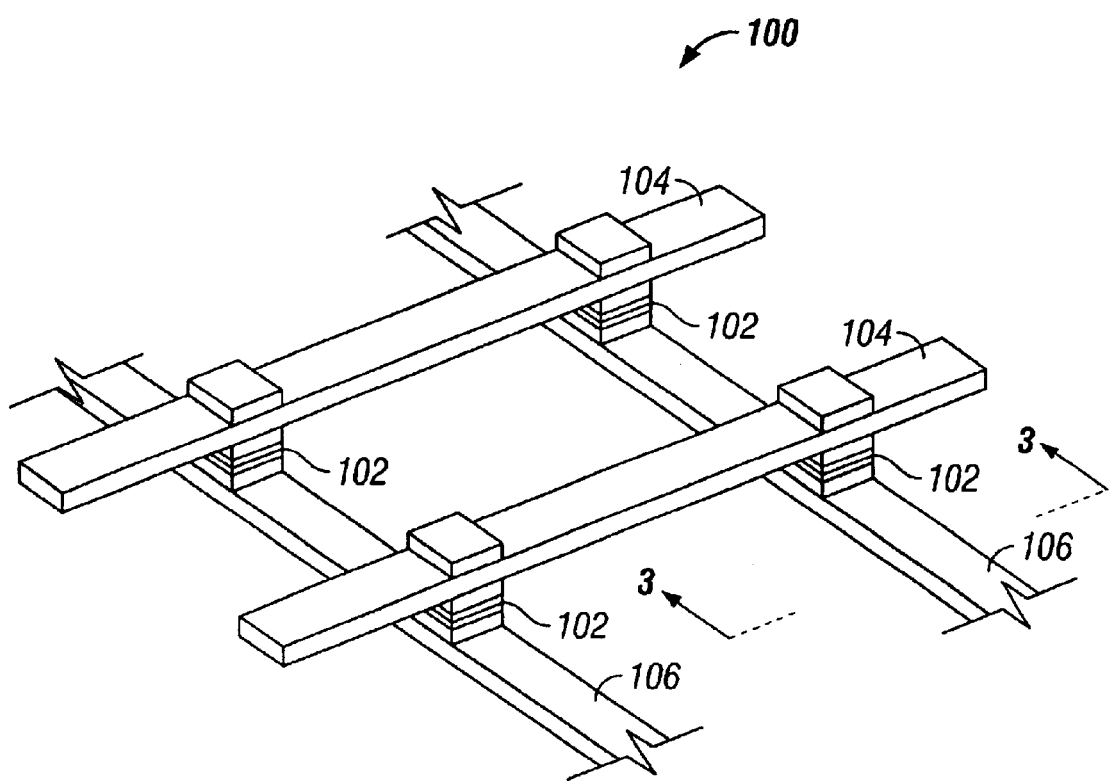
FIG. 2 is a perspective view showing an exemplary portion of a MTJ memory array according to an embodiment of the present invention.

FIG. 2 illustrates an exemplary Magnetic Random Access Memory (MRAM) array 100 according to a preferred embodiment of the invention. A plurality of magnetic tunnel junction (MTJ) cells 102 are provided at intersections of a rectangular grid of electrically conducive lines 104, 106. These electrically conductive lines include a set of conductive lines that function as parallel word lines 104, configured in a horizontal plane, and another set of parallel bit lines 106, arranged generally perpendicular with the word lines in another horizontal plane so that the word lines 104 and bit lines 106 form a grid and appear to intersect if viewed from above. Although two word lines 104 and two bit lines 106 are shown, one skilled in the art will recognize that the number of such lines would typically be much larger. A MTJ cell 102 is formed at each intersection of a word line 104 and a bit line 106 to vertically interconnect the word line with the bit line. The MTJ cell 102 can be switched between two possible resistance values, which define its binary memory state. During a sensing or reading operation of the array, a voltage is applied across the cell 102 between the word line 104 and bit line 106 corresponding to that MTJ cell 102, and the resistance value (i.e. memory state) is determined.

The vertical current path through the cell 102 permits the memory cell to occupy a very small surface area. While not shown in FIG. 2, the array may be formed on a substrate, such as silicon, which may contain other circuitry as well. In addition an insulating material (also not shown) usually separates the word lines 104 and bit lines 106 in regions other than the intersecting regions.

Figure 1:
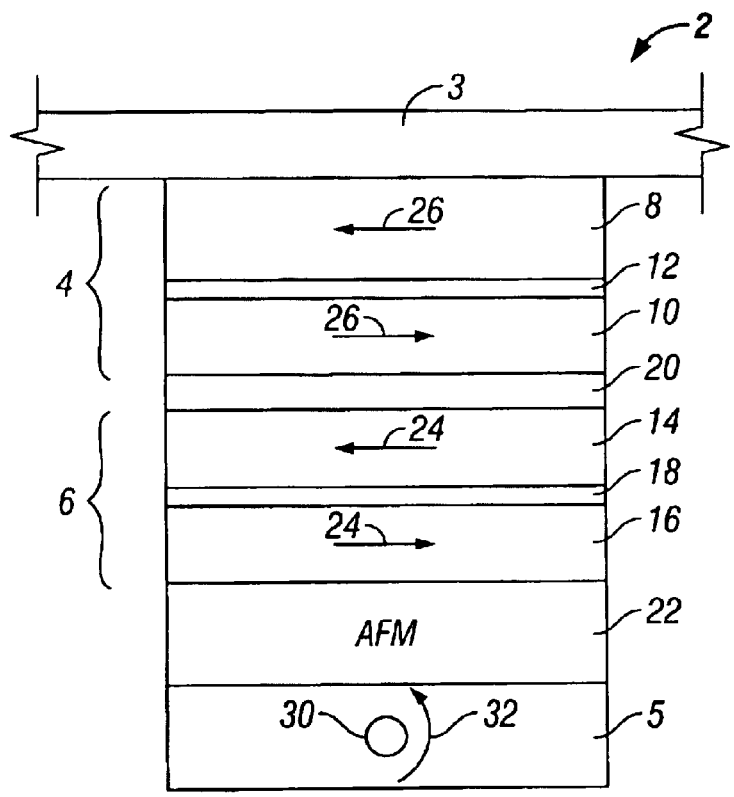
FIG. 1 is a cross sectional view showing a MTJ cell of a MTJ prior art MTJ memory array.
Figure 3:
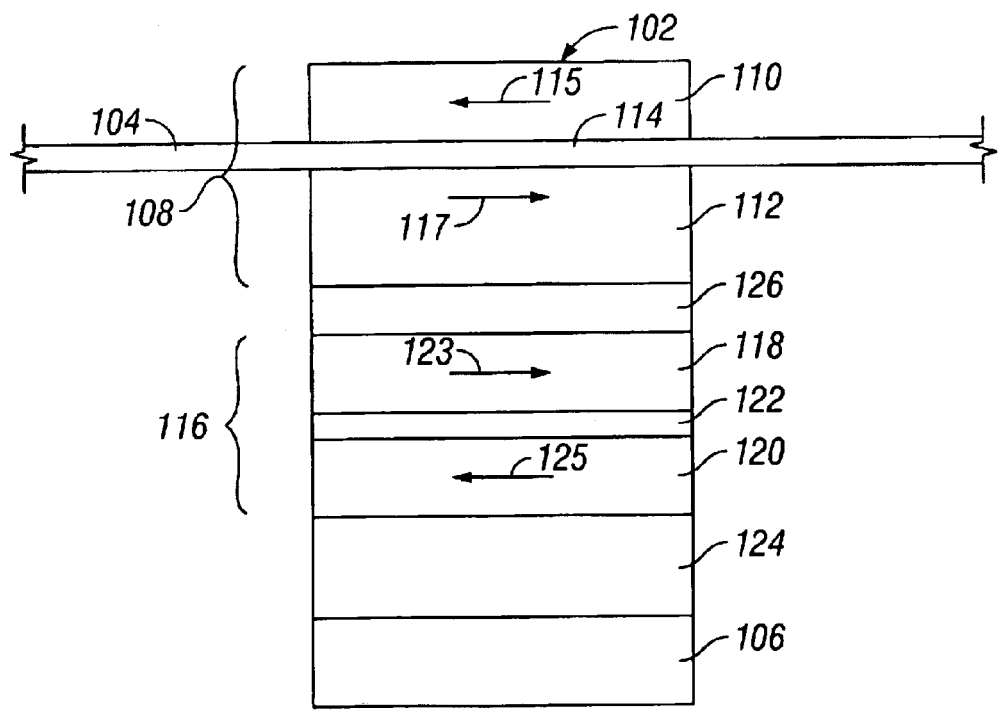
FIG. 3 is an enlarged, cross sectional view taken along line 3—3 of FIG. 2.

With reference to FIG. 3, a MTJ cell 102 according to a preferred embodiment of the invention includes an antiparallel (AP) coupled ferromagnetic free layer structure 108. The free layer structure 108 includes a first ferromagnetic layer 110 and a second ferromagnetic layer 112. The first and second ferromagnetic layers 110, 112 are separated from one another by a non-magnetic, electrically conductive coupling layer 114. The coupling layer 114 has a thickness selected to antiparallel couple the first and second ferromagnetic layers 110, 112. In addition, the second ferromagnetic layer 112 is preferably magnetically thicker than ferromagnetic layer 110, for reasons that will be discussed further below. The magnetic moments of layers 110 and 112 are indicated by arrows 115 and 117 respectively.

In the preferred embodiment of the invention, the word line 104 passes though the free layer 108 between the first and second ferromagnetic layers 110, 112 and, in that region, functions as the coupling layer 114. It will be recognized that while the portion of the word line 104 that passes through the cell 102 is of the selected thickness to antiparallel couple the ferromagnetic layers, the other portions of the word line can be some other thickness. Increasing thickness of the word line 104 outside of the cell is advantageous in reducing the resistance of the word line 104, however the thickness of the word line 104 should be such as not to electrically short the free and pinned layers 108, 116. For ease of manufacturing, the word line 104 should be thinner than the combined thichness of the first and second ferromagnetic layers 110, 112 and the coupling layer 114. It would also be possible to construct the coupling layer 114 of one material, such as for example Ru, and to construct separately the word line 104 of another material, such as Cu, so long as the word line 104 is in electrical contact with opposite ends of the free layer 108.

With continued reference to FIG. 3, the MTJ cell 102 also includes a magnetically pinned ferromagnetic layer 116. Preferably, the pinned layer includes antiparallel (AP) coupled first and second ferromagnetic layers 118, 120 separated by an AP coupling layer 122. The first and second ferromagnetic pinned layers 118, 120 will hereafter be referred to as AP1 and AP2 respectively. The AP1 layer 118 and AP2 layer 120 have magnetizations that are pinned along an axis that is parallel with the easy axis of the ferromagnetic layers 110, 112 of the free layer as indicated by arrows 123 and 125. The magnetization of AP2 120 is strongly pinned through exchange coupling with an antiferromagnetic (AFM) material layer 124 formed adjacent to the pinned layer 116, and the antiparallel coupling keeps AP1 strongly pinned in the direction opposite AP2. While several antiferromagnetic materials would be suitable, such as for example FeMn or NiMn, the AFM layer 118 is preferably PtMn, which possesses a desirable combination of corrosion resistance, Curie temperature, and exchange coupling characteristics. While the preferred embodiment has been described as having an AP coupled pinned layer, those skilled in the art will recognize that a simple single pinned layer could be used as well.

The bit line 106 passes beneath the MTJ cell 102, adjacent to and in electrical contact with the AFM layer, and runs along a direction that is perpendicular to the direction of the word line 104 and to the easy axis of magnetization of the free layer 108 and the pinned magnetic moments of the pinned layer 116. A thin insulating tunnel barrier layer 126 separates the free layer 108 from the pinned layer 116. The tunnel barrier layer 124 is constructed of an insulating material such as for example, alumina ($Al_2O_3$).

When the magnetic moments of the second ferromagnetic free layer 112 and AP1 118 are aligned in the same direction, the spin of electrons passing through these layers are in the same direction, which allows electrons to pass through the tunnel barrier 122 based on what is known as the tunnel valve effect. When the magnetic moment of free layer 112 is opposite that of AP1, the electrons of each layer tend to have opposite spins which renders them unable to pass easily through the tunnel layer 126. In other words, when the magnetic moments of free layer 112 and AP1 118 are in the same direction, the tunnel barrier layer 126 acts as a conductor and when the magnetic moments are opposite, the tunnel barrier 126 acts as an insulator. By applying a voltage across the tunnel junction cell 102 between its associated word line 104 and bit line 106, its resistance can be determined, thereby allowing the memory state of the tunnel junction cell 102 to be read.

The free layer 108 can be switched from one magnetic state to the other by selectively generating a current through the word and bit lines 104, 106 of the relevant tunnel junction 102. Magnetic fields emanating from the lines 104, 106 due to such current flow affect the magnetization of the free layer as will be described herein below.

Assuming that the tunnel junction cell 102 is initially in the low resistance state as shown in FIG. 3 with the magnetic moments 117, 123 of layers 112 and 118 in the same direction, a current is first generated in word line 104. As illustrated FIG. 4A, because the free layers 110 and 112 are located on opposite sides of the word line 104, and because they are antiparallel coupled, the magnetizations 115, 117 of layers 110, 112 will rotate in the same direction due to the influence of the magnetic field induced by the current flow through the word line 104. The magnetizations 115, 117 of layers 110 and 112 remain antiparallel, allowing them to remain in a relatively low energy state while being rotated.

Figure 4A:
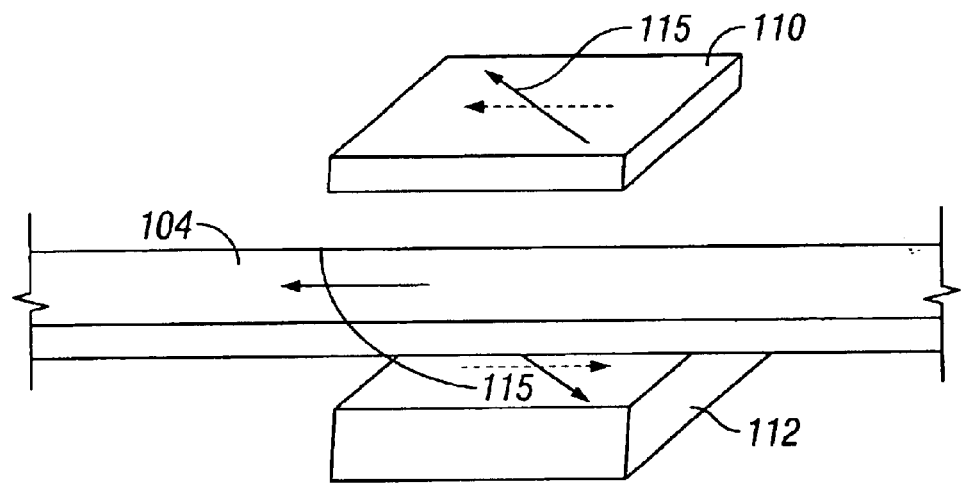
FIGS. 4A and 4B are exploded, perspective views of a MTJ memory array according to the present invention, which, for purposes of clarity, show only selected portions of the MTJ memory array.
Figure 4B:
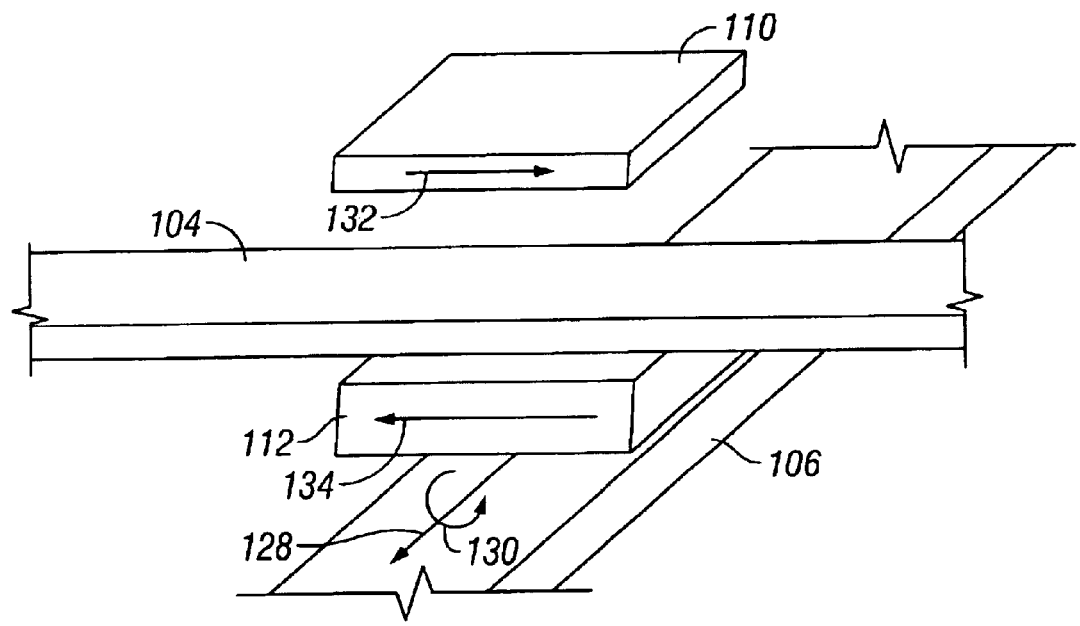

With continued reference to FIGS. 4A and 4B, while the current flow through the word line 104 initiates the rotation of the magnetization of the free layer, current flow through the bit line 106 completes the rotation. It will be appreciated that current flow through the bit line 106 will induce a magnetic field about the bit line according to the right hand rule. For example, a current flowing as indicated by arrow 128 in FIG. 4B, will generate a counterclockwise magnetic field as indicated by arrow 130. It will also be appreciated that, since the second ferromagnetic layer 112 of the free layer 108 is closer to the bit line 106 than the first ferromagnetic layer 110 is, the magnetic field will act more strongly on the second ferromagnetic layer 112 than on the first layer 110, causing the magnetizations to fully rotate to the positions indicated by arrows 132 in FIG. 4. The effect of the field from the bit line 106 on the free layer as 108, is further enhanced by the fact that, in the preferred embodiment, the second ferromagnetic layer 112 is thicker than the first ferromagnetic layer 110. This thickness difference creates a net magnetic moment for the AP coupled free layer 108 which allows the free layer 108 as a whole to be rotated by a field such as that emanating from the bit line 106. Once the magnetizations of the free layer 108 have rotated 180 degrees from their initial positions, they will once again be in their preferred state along the easy axis of magnetization. They will therefore remain in this state until acted upon again by fields from the word line 104 and bit line 106.

Figure 5:
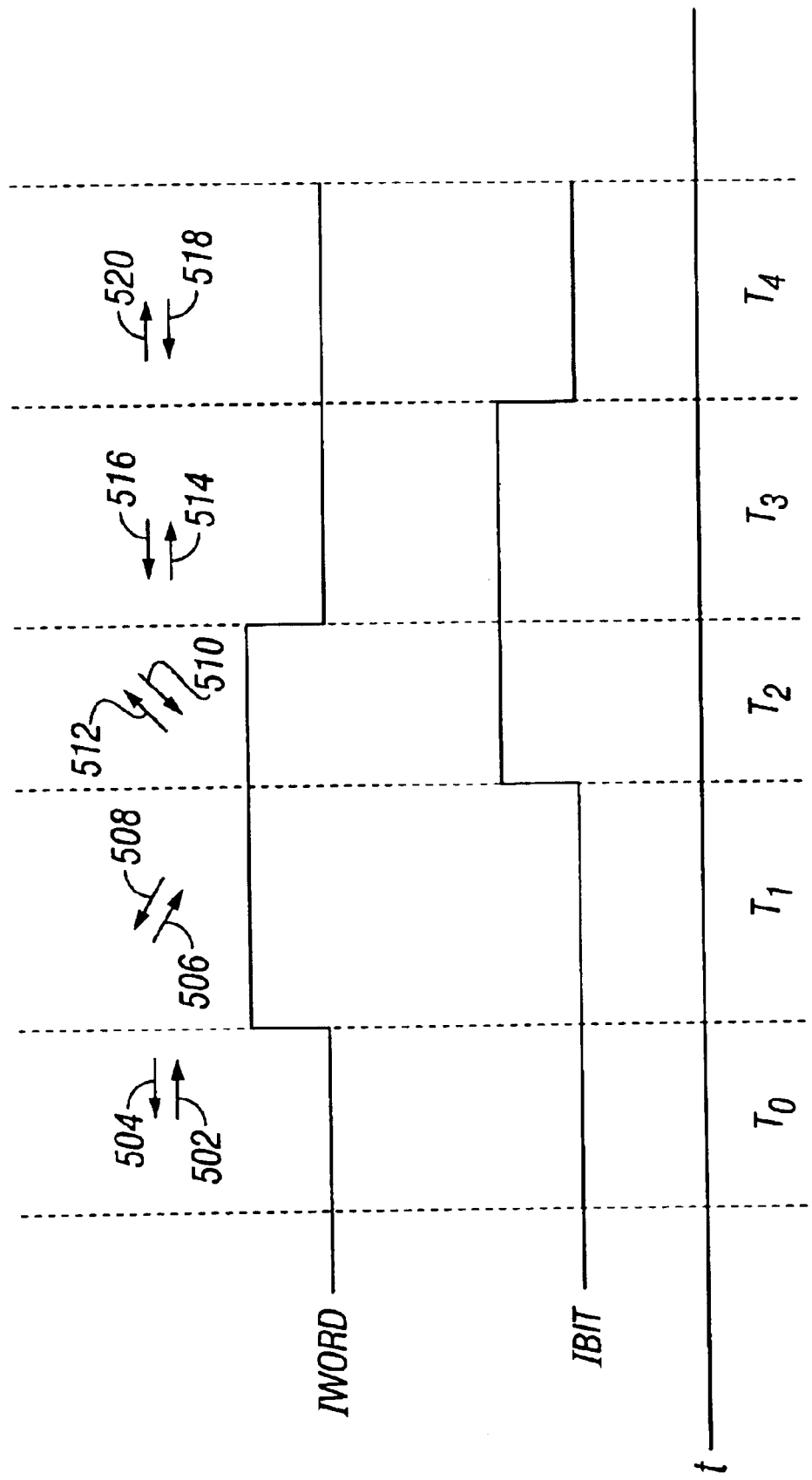
FIG. 5 is a graphical representation of electrical current flow in word and bit lines and its effect on magnetizations in a free layer of the MTJ memory array of the present invention.

The sequence of the current pulses from the word and bit lines 104, 106, and their effect on the magnetizations of the free layer, can be more readily understood with reference to FIG. 5 which illustrates the current pulses and the magnetizations along a common time line. Time segment $T_0$ shows the initial state of magnetization of the layers 110 and 112 of the free layer 108 as indicated by arrows 502 and 504 respectively. At time segment $T_1$, current is generated in the word line only, causing the magnetization of the free layer 108 to rotate as indicated by arrows 506 and 508. In time segment $T_2$, current is flowing through both the word line 104 and the bit line 106, causing the magnetization of the layer 110 and 112 of the free layer 108 to rotate further, as indicated by arrows 510 and 512. At time $T_3$ current is flowing only in the bit line 106 which completes the rotation of magnetizations of the free layer 108 so that they are 180 degrees from their initial state. This is illustrated by arrows 516 and 514. At time $T_4$ there is no current flow in either of the word or bit lines 104, 106. However, the magnetizations remain in their new state, as indicated by arrows 518 and 520, due to their being directed along the easy axis of magnetization and being, therefore, in a low energy state.

It will be appreciated that the present invention provides a stable magnetic tunnel junction memory array having tunnel junction cells that can be switched from one memory state to another with a minimal amount of input energy. While the invention has been particularly shown and described with reference to preferred embodiments thereof. For example, while the invention has been described as having a word line in contact with the free layer and a bit line in contact with an AFM layer, the order of the word line could be reversed so that the word line is formed adjacent to the AFM layer and the bit line contacts the free layer. Also, while the magnetization has been described as being fixed by exchange coupling with an antiferromagnetic material, such pinning could also be achieved by other means, such as hard bias. Therefore, it will be understood by those skilled in the art that various changes in form and details may be made therein without departing from the spirit and scope of the invention.

What is claimed is:

1. A magnetic cell for use in a magnetic random access memory array, comprising:

a pinned ferromagnetic layer having a magnetization fixed in a first direction;

a free layer structure, including first and second ferromagnetic layers each having an easy axis of magnetization substantially parallel with the first direction, and a non-magnetic, electrically conductive coupling layer disposed between the first and second ferromagnetic layers, the first and second ferromagnetic layers being antiferromagnetically coupled across the coupling layer;

a non magnetic spacer layer separating the pinned layer and the free layer structure; and first and second electrical leads, electrically connected with the coupling layer at substantially opposite ends along the first direction.

2. A magnetic cell as in claim 1 wherein the spacer layer is an electrical insulator.

3. A magnetic cell as recited in claim 1 wherein the non magnetic coupling layer is an electrically conducting material and the first and second ferromagnetic layers are magnetostatically coupled across the coupling layer.

4. A magnetic cell as recited in claim 1 wherein the non-magnetic coupling layer includes Ru.

5. A magnetic cell as recited in claim 1 wherein the non-magnetic coupling layer includes Cu.

6. A magnetic cell as recited in claim 1 further comprising an electrically conductive line, disposed adjacent the pinned magnetic layer, and configured to conduct an electrical current in a direction substantially perpendicular to the first direction.

7. A magnetic cell for use in a magnetic random access memory, comprising:

a sensor, comprising:
   a first ferromagnetic layer having an easy axis of magnetization;
   a second ferromagnetic layer having an easy axis of magnetization substantially parallel with the easy axis of magnetization of the first ferromagnetic layer;
   a non-magnetic coupling layer of electrically conductive material disposed, at least partially, between the first and second ferromagnetic layers and antiferromagnetically coupling the first and second ferromagnetic layers;
   an electrical lead connected with the non-magnetic coupling layer for conducting current in a direction substantially parallel with the easy axis of magnetization of the first and second ferromagnetic layers.

8. A magnetic cell as in claim 7, wherein the sensor is a tunnel valve.

9. A magnetic cell as recited in claim 7, wherein the magnetic coupling layer includes Ru.

10. A magnetic cell as recited in claim 7, wherein the magnetic coupling layer includes Cu.

11. A magnetic random access memory, comprising:

a first electrically conductive line longitudinally disposed along a first direction;

a second electrically conducive line longitudinally disposed along a second direction substantially perpendicular to the first direction;

a first ferromagnetic free layer having an easy axis of magnetization substantially parallel with the first direction;

a second ferromagnetic free layer having an easy axis of magnetization substantially parallel with the first direction;

a ferromagnetic pinned layer having a magnetization pinned in the first direction;

a non-magnetic spacer layer disposed between the second ferromagnetic free layer and the ferromagnetic pinned layer; and wherein the first electrical line passes between the first and second free magnetic layers and is of such a thickness between the first and second free layers to antiparallel couple the first and second free layers with one another.

12. A magnetic random access memory as in claim 11 further comprising an antiferromagnetic layer exchange coupled with the pinned layer to pin the direction of magnetization of the pinned layer.

13. A magnetic random access memory as in claim 12 wherein the antiferromagnetic layer is disposed between and in electrical contact with the pinned layer and the second electrically conductive line.

14. A method for switching memory states in a magnetic random access memory including a magnetic tunnel junction cell having an antiparallel coupled ferromagnetic free layer separated from a ferromagnetic pinned layer by a spacer layer, the method comprising:

generating a first electrical current along a first direction through the ferromagnetic free layer; and generating a second electrical current along a second direction that is substantially perpendicular to the first direction.

15. A method as set forth in claim 14 wherein the second current is directed along and axis that is spaced from the free magnetic layer.

16. A method as set forth in claim 14 wherein the generation of the first current is initiated prior to the generation of the second current.

17. A method as set forth in claim 14 further comprising:

terminating the generation of the first current; and terminating the second current flow after the termination of the first current flow.

* * * * *